United States Patent
Cheng et al.

(10) Patent No.: US 9,870,952 B1
(45) Date of Patent: Jan. 16, 2018

(54) FORMATION OF VFET AND FINFET

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/426,479

(22) Filed: Feb. 7, 2017

(51) Int. Cl.
*H01L 21/8234* (2006.01)
*H01L 27/088* (2006.01)
*H01L 21/8238* (2006.01)

(52) U.S. Cl.
CPC ........... *H01L 21/823487* (2013.01); *H01L 21/823412* (2013.01); *H01L 21/823425* (2013.01); *H01L 21/823431* (2013.01); *H01L 21/823857* (2013.01); *H01L 21/823864* (2013.01); *H01L 21/823871* (2013.01); *H01L 21/823885* (2013.01); *H01L 27/0886* (2013.01)

(58) Field of Classification Search
CPC ..... H01L 21/823487; H01L 21/823431; H01L 21/823425; H01L 21/823412; H01L 21/0886; H01L 21/823857; H01L 2/823864; H01L 21/823871; H01L 21/823885

See application file for complete search history.

(56) References Cited

U.S. PATENT DOCUMENTS

| 6,660,590 B2 | 12/2003 | Yoo |
| 6,846,709 B1 | 1/2005 | Lojek |
| 7,033,877 B2 | 4/2006 | Chaudhry et al. |
| 7,241,649 B2 | 7/2007 | Donze et al. |
| 7,250,658 B2 | 7/2007 | Doris et al. |

(Continued)

FOREIGN PATENT DOCUMENTS

CN 105118861 A 12/2015

OTHER PUBLICATIONS

Agarwal et al., "Benchmarking of MoS2 FETs with Multigate Si-FET Options for 5 nm and Beyond", IEEE, Transactions on Electron Devices, Dec. 2015, pp. 4051-4056, vol. 62, No. 12.

*Primary Examiner* — Savitr Mulpuri
(74) *Attorney, Agent, or Firm* — Erik K. Johnson

(57) ABSTRACT

An embodiment may include a method of forming a semiconductor device. The method may include forming a first fin in a VFET region, and a second fin in a finFET region, having a first and second hard cap respectively. The method may include removing the second hard cap. The method may include depositing a gate electrode and a gate dielectric. The method may include removing the gate metal and gate dielectric above the first hard cap in the VFET region, exposing a vertical surface of the first hard cap. The method may include forming a protective spacer adjacent to the vertical surface of the first hard cap that is thicker than the gate dielectric. The method may include forming gates in the VFET and finFET regions. The method may include removing the protective spacer and the first hard cap. The method may include forming a source/drain on the first fin.

19 Claims, 11 Drawing Sheets

(56) References Cited

U.S. PATENT DOCUMENTS

| | | | |
|---|---|---|---|
| 7,879,660 B2 | 2/2011 | Booth, Jr. et al. | |
| 9,029,218 B2 | 5/2015 | Loh et al. | |
| 9,245,885 B1 | 1/2016 | Xie et al. | |
| 9,385,219 B2 * | 7/2016 | Yieh | H01L 29/66803 |
| 9,431,305 B1 | 8/2016 | Anderson et al. | |
| 9,443,976 B1 | 9/2016 | Xie et al. | |
| 9,502,407 B1 * | 11/2016 | Anderson | H01L 29/78 |
| 9,515,166 B2 * | 12/2016 | Nemani | H01L 21/0228 |
| 9,607,899 B1 * | 3/2017 | Cheng | H01L 21/823487 |
| 9,741,716 B1 * | 8/2017 | Cheng | H01L 27/0886 |
| 2016/0005849 A1 | 1/2016 | Li et al. | |
| 2016/0163810 A1 | 6/2016 | Huang et al. | |

\* cited by examiner

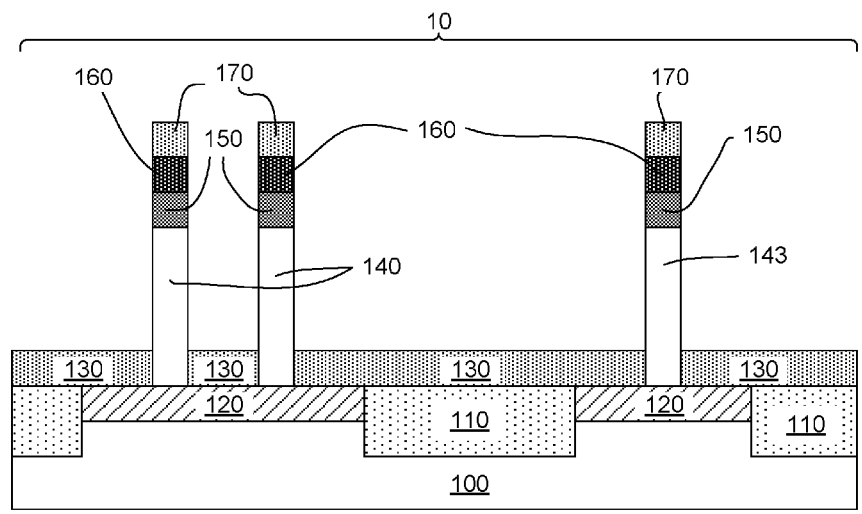
Figure 1A
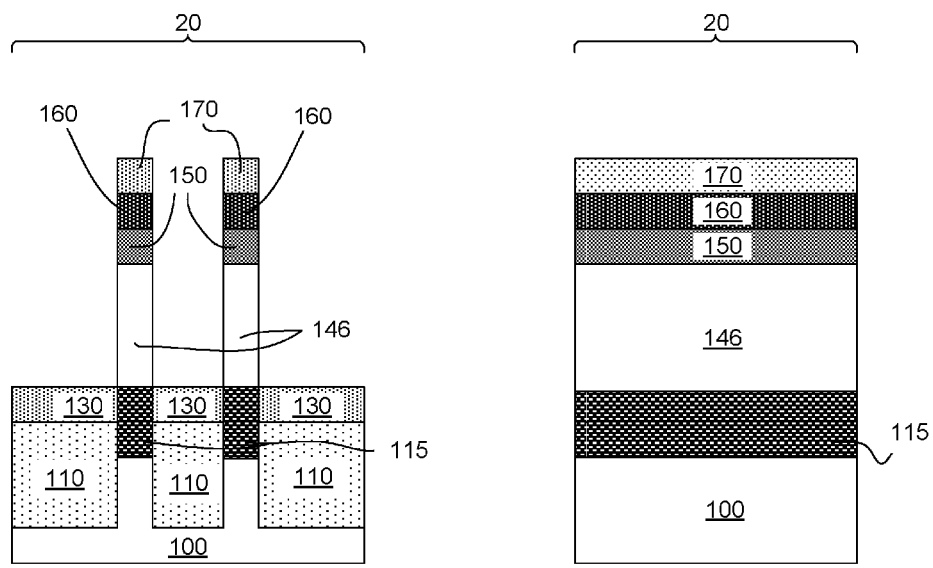
Figure 1B
Figure 1C

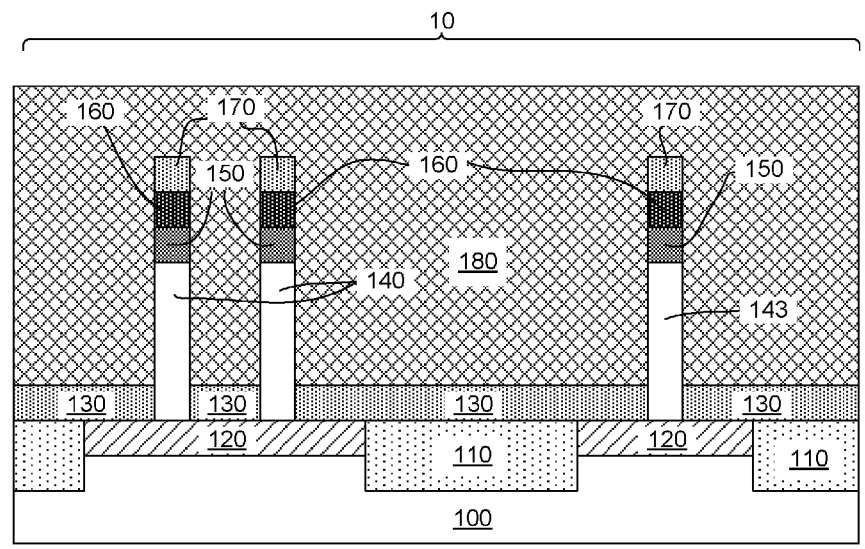
Figure 3A
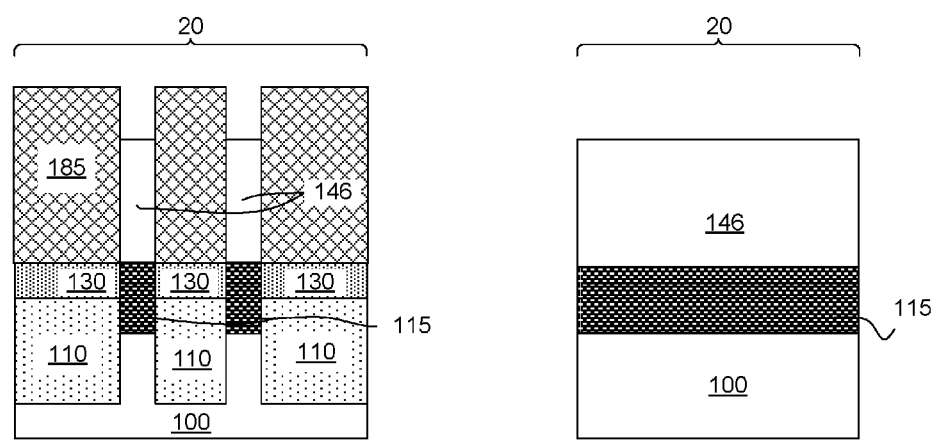
Figure 3B
Figure 3C

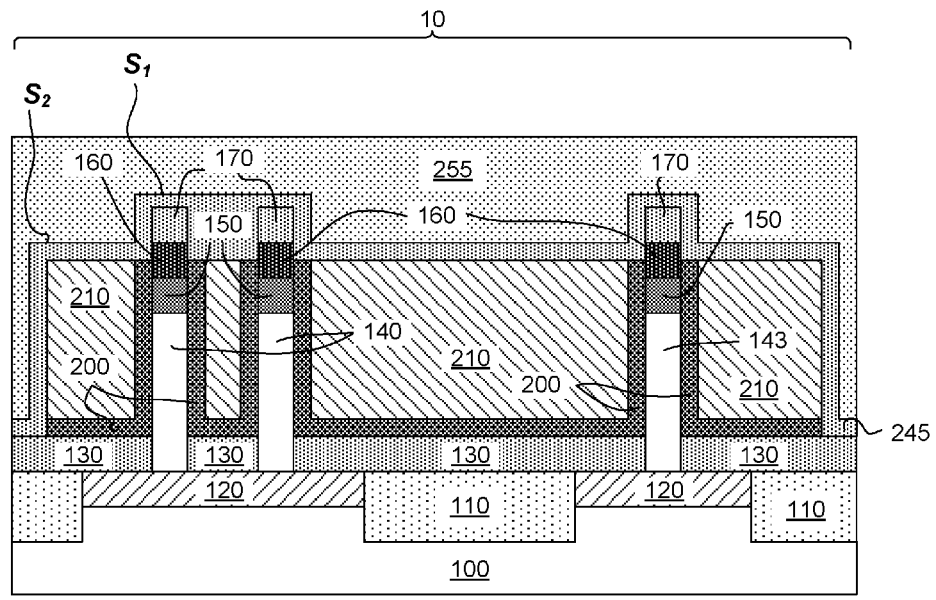
Figure 6A
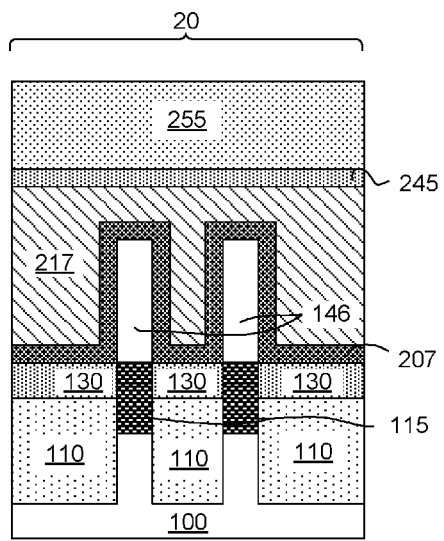 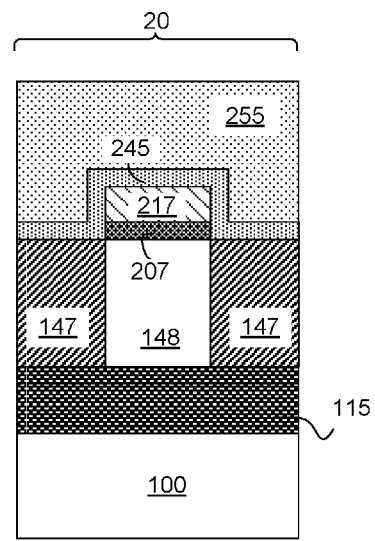
Figure 6B              Figure 6C

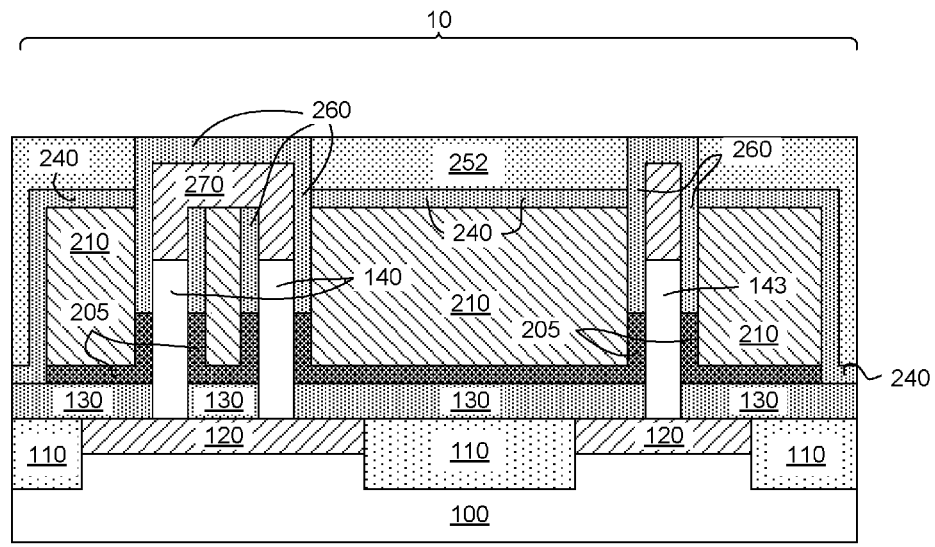
Figure 10A
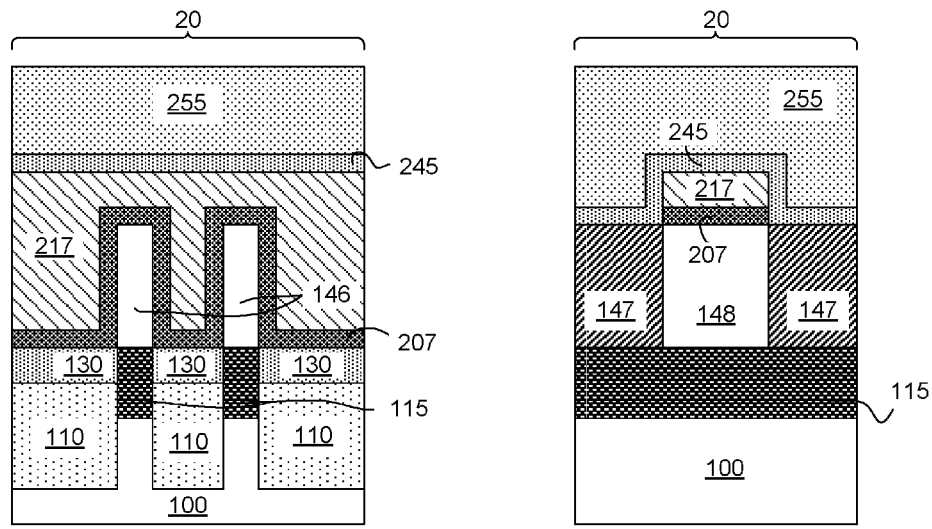
Figure 10B
Figure 10C

FORMATION OF VFET AND FINFET

BACKGROUND

The present invention relates to semiconductor structures, and more specifically, to integrating Vertical FETs with FinFETs.

FETs are commonly employed in electronic circuit applications. FETs may include a source region and a drain region spaced apart by a semiconductor channel region. In planar FETs, the semiconductor channel region may be a semiconductor substrate. In finFETs, the semiconductor channel region may be a semiconductor fin. A gate, potentially including a gate dielectric layer, a work function metal layer, and a metal electrode, may be formed above the channel region. By applying voltage to the gate, the conductivity of the channel region may increase and allow current to flow from the source region to the drain region.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

Vertical field effect transistors (VFET) are an emerging technology that may allow scaling below 15 nm due to their unique geometry. As compared to FinFETs, which are oriented such that current flows parallel to the surface of a die, with source/drain contacts oriented in similar direction, VFETs are aligned such that the current flow normal to the surface of the die, and having a gate layer parallel to the surface of the die, and surrounding the channel of the VFET. This may decrease the footprint of the structure on the surface of the die, as well as improving leakage across the gate, due to the gate surrounding the channel.

By integrating FinFET and VFET type transistors, more efficient devices may be created.

SUMMARY

An embodiment may include a method of forming a semiconductor device. The method may include forming a plurality of fins on a substrate, a first fin is located above a bottom source/drain in a VFET region. A second fin is located in a finFET region. A first hard cap is located on the first fin and a second hard cap is located on the second fin. The method may include forming a mask over the first fin in the VFET region. The method may include removing the second hard cap and the mask over the first fin in the VFET region. The method may include depositing a gate electrode and a gate dielectric surrounding the first fin and the first hard cap in the VFET region, and surrounding the second fin in the finFET region. The method may include removing the gate metal and gate dielectric above the first hard cap in the VFET region, and exposing a vertical surface of the first hard cap. The method may include forming a protective spacer adjacent to the vertical surface of the first hard cap. The thickness of the protective spacer may be greater than the thickness of the gate dielectric. The method may include forming a first gate in the VFET region and a second gate the second fin in the finFET region from the gate metal and gate dielectric. The method may include forming a finFET source drain on the second fin in the finFET region. The method may include removing the protective spacer and the first hard cap. The method may include forming a top source/drain on the first fin.

The method may further include an embodiment where the first hard cap comprises a top cap layer, and the material of the top cap layer is the same as the material of the protective spacer. This may allow for simultaneous removal of the first hard cap and the protective spacer.

The method may further include depositing a spacer layer over the finFET region and the VFET region, an embodiment where depositing the spacer layer in the VFET region creates a first surface of the spacer layer in the portion of the spacer layer located above the first hard cap and a second surface of the spacer layer above the gate metal. The method may further include forming an insulating layer above the spacer layer in the finFET region and the VFET region. The method may further include removing the insulating layer located above the first surface of the spacer layer in the VFET region. This may act as an integrated spacer formation, and ILD formation, following patterning of the gates.

The method may further include removing the spacer layer, the first hard cap and the protective spacer located beneath the first surface of the spacer layer. This may expose the VFET gate for subsequent processing steps.

The method may further include an embodiment where removing the insulating layer located above the first spacer layer comprises chemical mechanical polishing. This may maintain a substantially planar surface across the device, while exposing the first surface of the spacer layer.

The method may further include forming a top source/drain of the first fin, recessing the gate dielectric located along a vertical portion of the first fin. This may shorten the channel region of the resulting VFET device, thereby improving resistance across the VFET device.

The method may further include an embodiment where the first hard cap includes an intermediate cap layer disposed between the top cap layer and a bottom cap layer, the intermediate cap layer includes a dummy material capable of being selectively removed with respect to the bottom cap layer.

The method may further include an embodiment where the thickness of the intermediate cap layer is about 10 to about 50 nm, and the thickness of the bottom cap layer is about 1 to about 5 nm.

The method may further include an embodiment where the top cap layer comprises silicon nitride, the bottom cap layer comprises silicon oxide, and the intermediate cap layer comprises amorphous silicon.

Another embodiment may include a method of forming a semiconductor device. The method may include forming a plurality of fins on a substrate, having a first fin is located above a bottom source/drain in a VFET region, a second fin is located in a finFET region, and a first hard cap is located on the first fin and a second hard cap is located on the second fin. The method may include removing the second hard cap. The method may include depositing a gate electrode and a gate dielectric surrounding the first fin and the first hard cap in the VFET region, and surrounding the second fin in the finFET region. The method may include removing the gate metal and gate dielectric above the first hard cap in the VFET region, and exposing a vertical surface of the first hard cap. The method may include forming a protective spacer adjacent to the vertical surface of the first hard cap, where the thickness of the protective spacer is greater than the thickness of the gate dielectric. The method may include forming a first gate in the VFET region and a second gate the second fin in the finFET region from the gate metal and gate dielectric. The method may include depositing a spacer layer over the finFET region and the VFET region. Depositing the spacer layer in the VFET region creates a first surface of the spacer layer in the portion of the spacer layer located above the first hard cap and a second surface of the spacer layer above the gate metal. The method may include forming an insulating layer above the spacer layer in the finFET region and the VFET region. The method may include removing the insulating layer located above the first surface of the spacer layer in the VFET region. The method may include forming a finFET source drain on the second fin in the finFET region. The method may include removing the protective spacer and the first hard cap. The method may include forming a top source/drain on the first fin.

The method may further include an embodiment where the first hard cap comprises a top cap layer, and the material of the top cap layer is the same as the material of the protective spacer. This may allow for simultaneous removal of the first hard cap and the protective spacer.

The method may further include removing the spacer layer, the first hard cap and the protective spacer located beneath the first surface of the spacer layer. This may expose the VFET gate for subsequent processing steps.

The method may further include an embodiment where removing the insulating layer located above the first spacer layer comprises chemical mechanical polishing. This may maintain a substantially planar surface across the device, while exposing the first surface of the spacer layer.

The method may further include forming a top source/drain of the first fin, recessing the gate dielectric located along a vertical portion of the first fin. This may shorten the channel region of the resulting VFET device, thereby improving resistance across the VFET device.

The method may further include an embodiment where the first hard cap further comprises an intermediate cap layer disposed between the top cap layer and a bottom cap layer, the intermediate cap layer comprises a dummy material capable of being selectively removed with respect to the bottom cap layer.

The method may further include an embodiment where the thickness of the intermediate cap layer is about 10 to about 50 nm, and the thickness of the bottom cap layer is about 1 to about 5 nm.

The method may further include an embodiment where the top cap layer comprises silicon nitride, the bottom cap layer comprises silicon oxide, and the intermediate cap layer comprises amorphous silicon.

Another embodiment may include a method of forming a semiconductor device. The method may include forming a plurality of fins on a substrate, where a first fin is located above a bottom source/drain in a VFET region, and a second fin is located in a finFET region. The method may include depositing a gate electrode and a gate dielectric surrounding the first fin in the VFET region, and surrounding the second fin in the finFET region. The method may include removing the gate metal and gate dielectric above the first fin in the VFET region, and exposing a vertical surface of the first fin. The method may include forming a protective spacer adjacent to the vertical surface of the first fin, where the thickness of the protective spacer is greater than the thickness of the gate dielectric. The method may include forming a first gate in the VFET region and a second gate the second fin in the finFET region from the gate metal and gate dielectric. The method may include depositing a spacer layer over the finFET region and the VFET region, where depositing the spacer layer in the VFET region creates a first surface of the spacer layer in the portion of the spacer layer located above the first hard cap and a second surface of the spacer layer above the gate metal. The method may include forming an insulating layer above the spacer layer in the finFET region and the VFET region. The method may include removing the insulating layer located above the first surface of the spacer layer in the VFET region. The method may include forming a finFET source drain on the second fin in the finFET region. The method may include removing the protective spacer and the first hard cap. The method may include forming a top source/drain on the first fin.

The method may further include an embodiment where removing the insulating layer located above the first spacer layer comprises chemical mechanical polishing. This may maintain a substantially planar surface across the device, while exposing the first surface of the spacer layer.

The method may further include forming a top source/drain of the first fin, recessing the gate dielectric located along a vertical portion of the first fin. This may shorten the channel region of the resulting VFET device, thereby improving resistance across the VFET device.

BRIEF DESCRIPTION OF THE DRAWINGS

FIG. 1A depicts a cross section of a set of fins in a VFET region on a semiconductor device, according to an example embodiment;

FIG. 1B depicts a cross section of a horizontal fin in a finFET region on the semiconductor device, according to an example embodiment;

FIG. 1C depicts a side view of the horizontal fin in the finFET region on the semiconductor device, according to an example embodiment;

FIG. 3A depicts a cross section of the set of fins in the VFET region on a semiconductor device following masking of the VFET region and removing the capping layers in the finFET region, according to an example embodiment;

FIG. 3B depicts a cross section of the horizontal fin in the finFET region on the semiconductor device following masking of the VFET region and removing the capping layers in the finFET region, according to an example embodiment;

FIG. 3C depicts a side view of the horizontal fin in the finFET region on the semiconductor device following masking of the VFET region and removing the capping layers in the finFET region, according to an example embodiment;

FIG. 6A a cross section of the set of fins in the VFET region on a semiconductor device following spacer formation and ILD deposition, according to an example embodiment;

FIG. 6B depicts a cross section of the horizontal fin in the finFET region on the semiconductor device following spacer formation and ILD deposition, according to an example embodiment;

FIG. 6C depicts a side view of the horizontal fin in the finFET region on the semiconductor device following spacer formation and ILD deposition, according to an example embodiment;

FIG. 10A depicts a cross section of the set of fins in the VFET region on a semiconductor device following epitaxial growth of the source drain and spacer formation in the VFET region, according to an example embodiment;

FIG. 10B depicts a cross section of the horizontal fin in the finFET region on the semiconductor device following epitaxial growth of the source drain and spacer formation in the VFET region, according to an example embodiment;

FIG. 10C depicts a side view of the horizontal fin in the finFET region on the semiconductor device following epitaxial growth of the source drain and spacer formation in the VFET region, according to an example embodiment;

Figure 2:
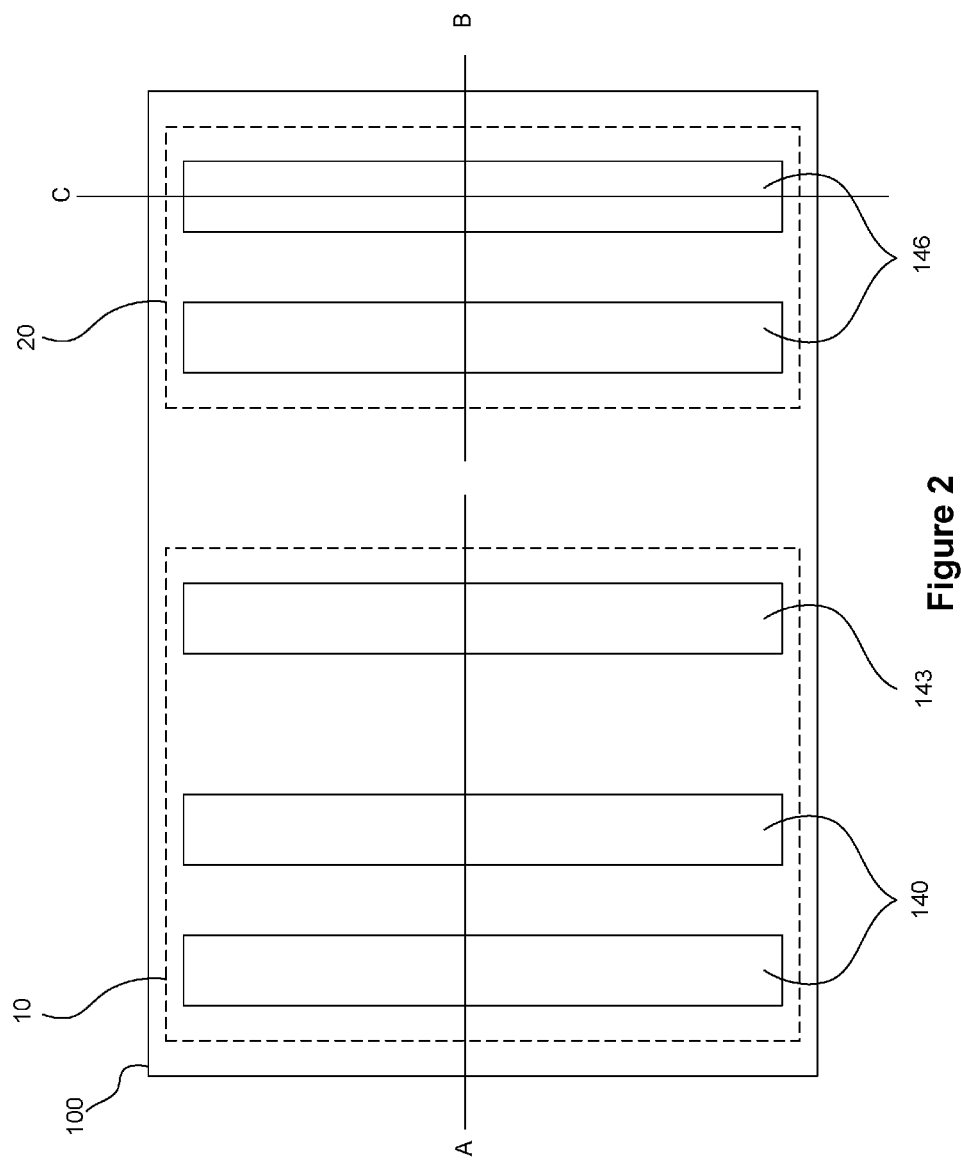
FIG. 2 depicts the VFET region and finFET region located on the same substrate, and the perspective views taken for the figures, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The terms substantially, substantially similar, or about refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

Introduction of VFET structures with more traditional FinFET structures may enable improved device performance by allowing for increased transistor density, due to the lower footprint of VFET devices. Additionally, the geometry may allow for introduction of such devices in 2.5D and 3D packaging structures, thereby maximizing the usage of the space on the chip. However, current techniques for integrating such devices employ a "1 at a time approach," which increases the cost of manufacturing. Presented herein is a method of integrating a VFET and FinFET process Referring to FIGS. 1A-1C, a semiconductor structure having fins may be formed. FIG. 1A depicts a set of fins, dual fins 140 and single fin 143, in a VFET region 10, while FIG. 1B and FIG. 1C depict dual views of horizontal fins 146 in a FinFET region 20. In the VFET region 10, dual fins 140 and single fin 143 may be separated from a substrate 100 by a source/drain 120. For example, FIG. 2 depicts an arrangement of VFET region 10 and FinFET region 20, located on substrate 100. In FIG. 2, perspective-line A represents the cross-sectional view in "A" labeled figures, perspective-line B represents the cross-sectional view taken in "B" labeled figures, perspective-line C represents the cross-sectional view in "C" labeled figures. Additionally, while the example embodiment depicts VFET region 10 is having a single and dual fin arrangement, and FinFET region 20 has two fins, the use of more or less fins in these regions is contemplated.

Isolation layer 110 may electrically isolate distinct FETs from each other. For example, isolation layer 110 may isolate dual fins 140 from single fin 143 in the VFET region 10, or alternatively may isolate horizontal fins 146 from each other. Isolation layer 110 may be formed using known shallow trench isolation techniques.

In the horizontal fin region, horizontal fins 146 may be isolated from substrate 100 by a punch-through stop (PTS) layer 115. The PTS layer 115. PTS layer 115 may be formed through epitaxial growth, dopant implantation techniques, or other techniques known in the art.

Dual fins 140, single fin 143 and horizontal fins 146 (hereinafter "the fins") may have an oxide cap 150, an amorphous cap 160 and a nitride cap 170 located above each fin. The nitride cap 170 may be selected to be the same material as a subsequent spacer layer, allowing for simultaneous selective etching, such as, for example, silicon nitride and may have a thickness of approximately 10 nm to 50 nm. The amorphous cap 160 may be any dummy type material may be selectively etched with minimal damage to the other structures such as, for example, amorphous silicon and may have a thickness of approximately 10 nm to 50 nm. The oxide cap may be selected as a thin buffer layer to protect the fins during removal of the amorphous cap, for example, silicon oxide and may have a thickness of approximately 1 nm to 5 nm. By minimizing the thickness of the oxide cap 150, this may reduce the amount of unwanted etching of other layers, such as an Inter Level Dielectrics (ILDs), in subsequent steps.

The fins may be formed on substrate 100. The fins may have a width ranging from approximately 4 nm to approximately 40 nm, preferably approximately 6 nm to approximately 15 nm; a height ranging from approximately 10 nm to approximately 200 nm, preferably approximately 20 nm to approximately 80 nm. The fins may be formed, for example by removing material from the substrate 100 using a photolithography process followed by an anisotropic etching process such as reactive ion etching (RIE) or plasma etching. Other methods of forming fins known in the art may also be utilized, such as sidewall image transfer (SIT). Prior to formation of the fins, the material for the oxide cap 150, amorphous cap 160 and nitride cap 170 may be deposited above a bulk material, and formation of the fins would leave the resulting material above each of the fins.

In some embodiments, the substrate 100 may be either a bulk substrate or a semiconductor on insulator (SOI) substrate. In embodiments where the substrate 100 is a bulk substrate, the material of the fins may be the same as the substrate 100 and there may be no identifiable boundary between the fins and the substrate 100. The substrate 100 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In embodiments where the substrate 100 is an SOI substrate, the fins may be formed from a top semiconductor layer separated from a base semiconductor substrate by a buried insulator layer (not shown). In such embodiments, the top semiconductor layer and the base semiconductor substrate 100 may be made of the same materials as the bulk substrate discussed above. The buried insulator layer may have a thickness ranging from approximately 100 to approximately 500 nm, preferably about 200 nm. In such embodiments, the fins may rest on the buried insulator layer, separated from the base semiconductor substrate.

Dual fins 140, single fin 143 and horizontal fins 146 may be made from the same material as those mentioned for substrate 100. Additionally, each fin may independently be doped, or grown, to form, for example, n-type or p-type gates, or undoped to maximize the channel mobility.

Source/drain 120 may be located beneath the base of dual fins 140 and single fin 143, acting as one of the source/drains for the vertical transistor. Source/drain 120 may be formed by doping a top layer of substrate 100, or alternatively from epitaxially growing the source/drain material above the substrate 100.

A first spacer layer 130 may be located near the bottom of the fins. The first spacer layer 130 may be made of any insulating material, such as silicon nitride, silicon oxide, silicon oxynitrides, or a combination thereof, and may have a thickness ranging from 4 nm to approximately 15 nm, preferably approximately 5 nm to approximately 10 nm. The first spacer layer 130 may be formed by any method known in the art, including directional deposition of the spacer layer above the semiconductor structure.

Referring to FIGS. 3A-3C, a masking layer 180 may be formed above the semiconductor structure of FIGS. 1A-1C, and selectively recessed in the FinFET region 20, forming a recessed mask 185, and exposing at least the nitride cap 170 in the FinFET region 20. Selectively recessing the masking layer 180 may be performed by forming a lithographic pattern over the VFET region 10, and etching away the masking layer in the FinFET region 20, form recessed mask 185. The oxide cap 150, amorphous cap 160 and nitride cap 170 may then be removed in the FinFET region 20 to expose the horizontal fin 146.

The masking layer 180 may be any material suitable to protect the VFET region 10 during processing steps occurring in the FinFET region 20, such as an oxide or organic polymer layer, and may be deposited using any suitable process.

Figure 4A:
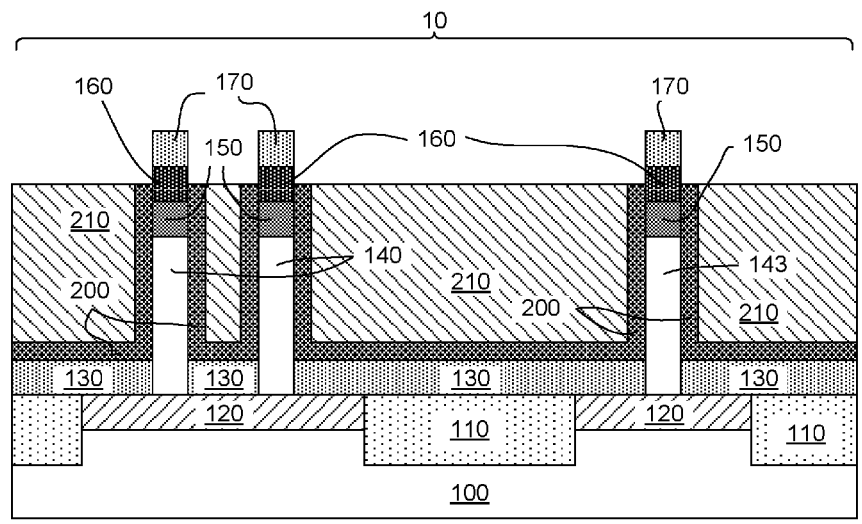
FIG. 4A depicts a cross section of the set of fins in the VFET region on a semiconductor device following removal of the mask, deposition of gate dielectric and metal, and opening capping layers in the VFET region, according to an example embodiment.
Figure 4B:
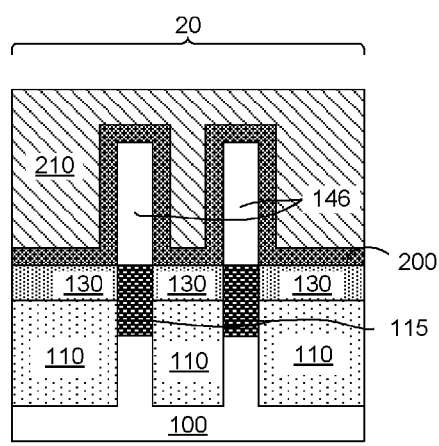
FIG. 4B depicts a cross section of the horizontal fin in the finFET region on the semiconductor device following removal of the mask, deposition of gate dielectric and metal, and opening capping layers in the VFET region, according to an example embodiment.
Figure 4C:
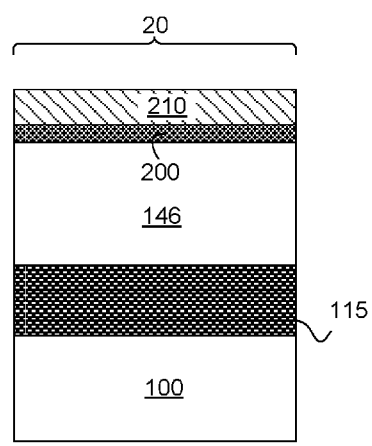
FIG. 4C depicts a side view of the horizontal fin in the finFET region on the semiconductor device following removal of the mask, deposition of gate dielectric and metal, and opening capping layers in the VFET region, according to an example embodiment.

Referring to FIGS. 4A-4C, the masking layer 180 and recessed mask 185 may be removed, and a gate dielectric and workfunction metal (WFM) layer 200 and gate electrode 210 may be deposited followed by planarization and etch back. Please note that the remaining height of the recessed gate stack (including gate dielectric and gate metal) should be taller than the top FIN surface of the horizontal FINFET, but under the 170 of the VFET. In one embodiment, the gate dielectric may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The dielectric layer 200 may be deposited using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating. In some embodiments, a high temperature anneal may be performed prior to the deposition of the gate electrode 210.

A gate electrode 210 may be deposited above the dielectric and WFM layer 200 The gate electrode 210 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode 210 may be formed using any suitable metal deposition technique, including, for example, CVD, PVD, and ALD, sputtering, and plating. Subsequently, the dielectric layer 200 and gate electrode 210 may be recessed, exposing at least 170 in the VFET region 10.

Figure 5A:
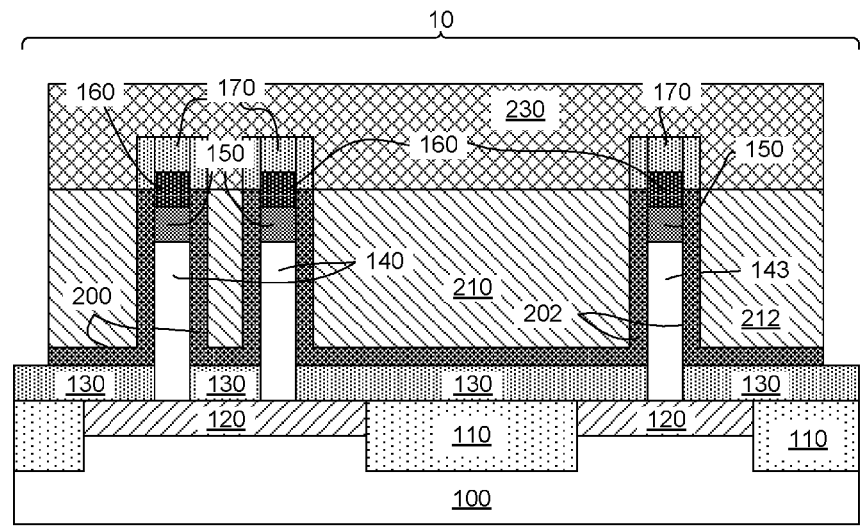
FIG. 5A depicts a cross section of the set of fins in the VFET region on a semiconductor device following patterning the gates in the VFET and finFET regions, according to an example embodiment.
Figure 5B:
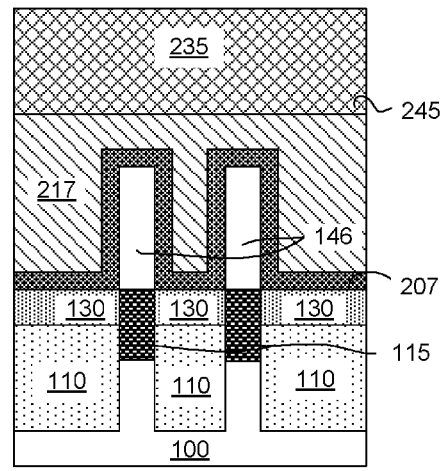
FIG. 5B depicts a cross section of the horizontal fin in the finFET region on the semiconductor device following patterning the gates in the VFET and finFET regions, according to an example embodiment.
Figure 5C:
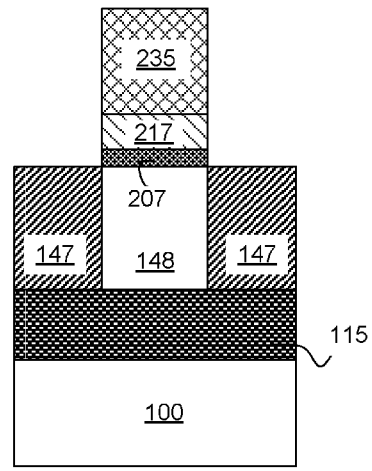
FIG. 5C depicts a side view of the horizontal fin in the finFET region on the semiconductor device following patterning the gates in the VFET and finFET regions, according to an example embodiment.

Referring to FIGS. 5A-5C, a protective spacer 175 is formed adjacent to the exposed vertical surface above the single fin 143 or dual fins 140, such as nitride cap 170, to protect the gate dielectric and WFM layer 200 of the VFET during gate patterning. The protective spacer 175 may be made of the same material as nitride cap 170 and second spacer layer 245 (discussed below), such as, for example, silicon nitride, silicon oxide, silicon oxynitrides, or a combination thereof. Protective spacer 175 may use the same material as nitride cap 170, allowing for simultaneous selective removal of the nitride cap 170 and protective spacer 175. The protective spacer 175 may be formed by any method known in the art, including depositing a conformal silicon nitride layer over the structure and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the protective spacer 175 may include one or more layers. In an example embedment, the thickness $T_1$ of the protective spacer 175 is bigger than the thickness $T_2$ of the gate dielectric and WFM layer 200.

A gate region may be patterned and etched, forming a FinFET HKMG 207 and FinFET gate electrode 217 in the FinFET region 20 and VFET HKMG 202 and VFET gate electrode 212 in the VFET region 10. A doped source/drain region 147 may be formed in the horizontal fin 146, creating a channel region 148 from the undoped portion of the horizontal fin 146. To pattern the gate region, a masking layer may be deposited above the VFET region 10 and FinFET region 20, and patterning may occur using a photolithographic mask over the desired regions and etching of the exposed masking layer, forming a VFET mask 230 and FinFET mask 235. The masking layer, and resulting VFET mask 230 and FinFET mask 235, may include, for example, an organic planarization layer (OPL), an oxide hardmask, or combinations thereof. Etching the masking layer may be accomplished through any combination of known techniques, such as, for example, RIE, wet stripping and plasma etching.

Following formation of the FinFET mask 235, an ion implantation (I/I) of a dopant or dopants is performed on the exposed portions of horizontal fin 146, forming a doped source/drain region 147, and a channel region 148 from the undoped portion of the horizontal fin 146. In some embodiments, dopants may include any suitable semiconductor dopant such as, for example, but not limited to Boron, Arsenic, Phosphorus and combinations thereof. The dopant may be implanted in concentrations ranging from approximately $1\times10^{18}$ atoms/cm$^3$ to approximately $5\times10^{19}$ atoms/cm$^3$.

Referring to FIGS. 6A-6C, a second spacer layer 245 and inter level dielectric (ILD) 255 may be deposited. The second spacer layer 245 may be made of any insulating material, such as silicon nitride, silicon oxide, silicon oxynitrides, or a combination thereof, and may have a thickness ranging from 3 nm to approximately 20 nm, preferably approximately 3 nm to approximately 8 nm. The second spacer layer 245 may be formed by any method known in the art, including conformal deposition of the spacer layer above the semiconductor structure. Additionally, deposition of the second spacer layer 245 in the VFET region 10 may create a two tiered surface, a first surface $S_1$ and a second surface $S_2$, above the gate electrode 210.

Figure 7A:
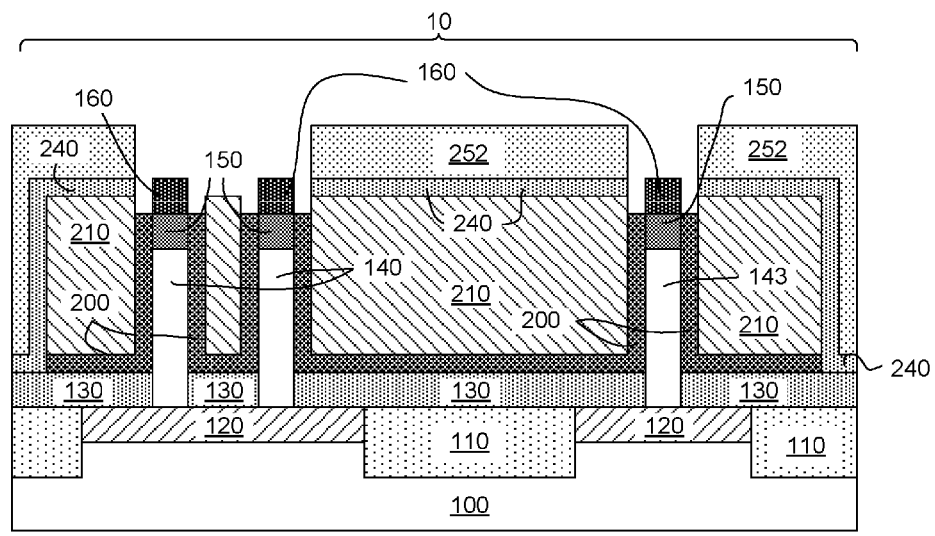
FIG. 7A depicts a cross section of the set of fins in the VFET region on a semiconductor device following opening the VFET capping layers and removing the top capping layer, according to an example embodiment.
Figure 7B:
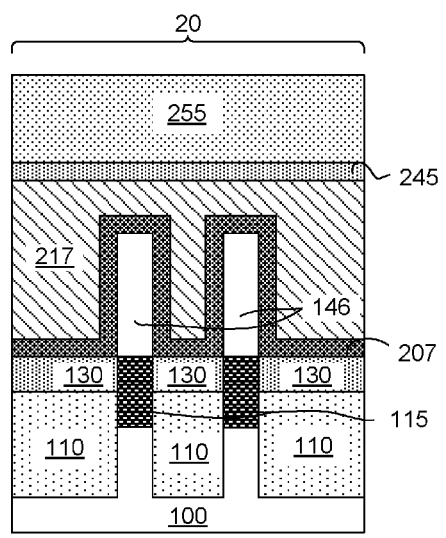
FIG. 7B depicts a cross section of the horizontal fin in the finFET region on the semiconductor device following opening the VFET capping layers and removing the top capping layer, according to an example embodiment.
Figure 7C:
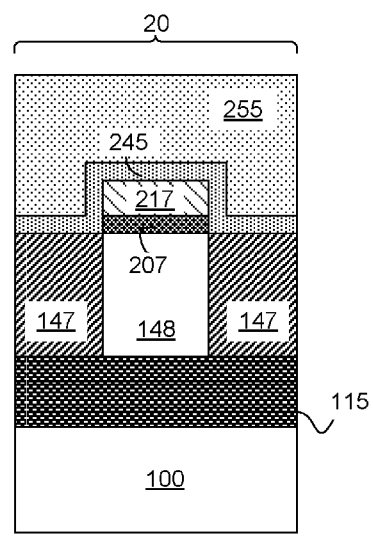
FIG. 7C depicts a side view of the horizontal fin in the finFET region on the semiconductor device following opening the VFET capping layers and removing the top capping layer, according to an example embodiment.

The ILD 255 may be deposited using typical deposition techniques, for example, chemical vapor deposition. The ILD 255 may include any suitable dielectric material, for example, silicon nitride, silicon nitride, silicon oxynitride, silicon carbide, silicon carbon nitride, or other known capping materials. Referring to FIGS. 7A-7C, amorphous cap 160 in the VFET Region 10 may be exposed. In an example embodiment, chemical mechanical polishing (CMP) may be performed on the semiconductor structure, reducing the thickness of ILD 250 so that the spacer layer 240 in the VFET region 10 is exposed. Following CMP, a selective etch may be performed on the structure, removing the spacer layer 240 above the dual fins 140 and single fin 143 and dielectric layer 200. The etch may be chosen to selective remove the material used to form second spacer layer 245 and nitride cap 170, while maintaining amorphous cap 160 and ILD 250.

Figure 8A:
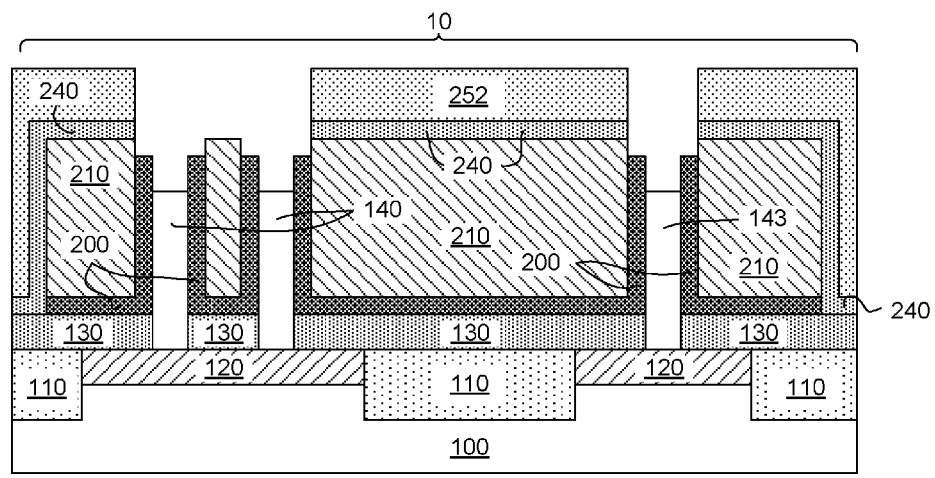
FIG. 8A depicts a cross section of the set of fins in the VFET region on a semiconductor device following removal of the capping layers in the VFET region, according to an example embodiment.
Figure 8B:
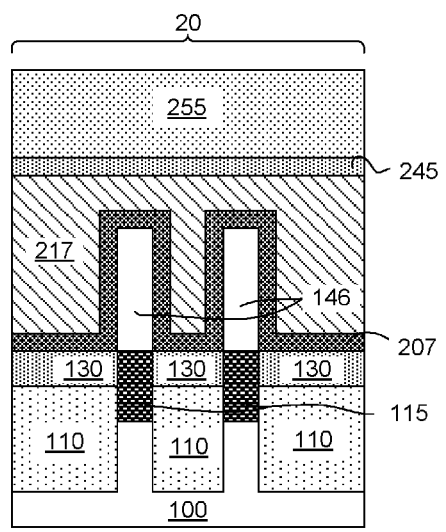
FIG. 8B depicts a cross section of the horizontal fin in the finFET region on the semiconductor device following removal of the capping layers in the VFET region, according to an example embodiment.
Figure 8C:
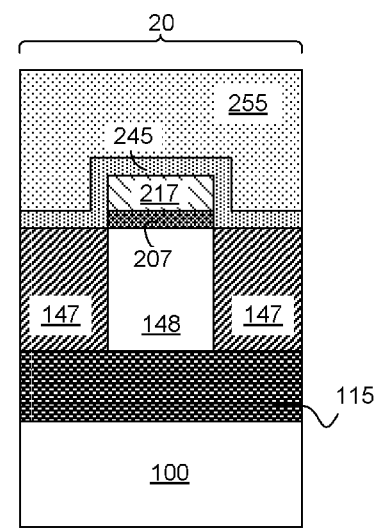
FIG. 8C depicts a side view of the horizontal fin in the finFET region on the semiconductor device following removal of the capping layers in the VFET region, according to an example embodiment.

Referring to FIGS. 8A-8C, oxide cap 150 and amorphous cap 160 may be removed in the vfet region 10, exposing the dual fins 140 and single fin 143. The oxide cap 150 and amorphous cap 160 may be selective etched using any suitable etching technique such as, for example, a plasma dry etch.

Figure 9A:
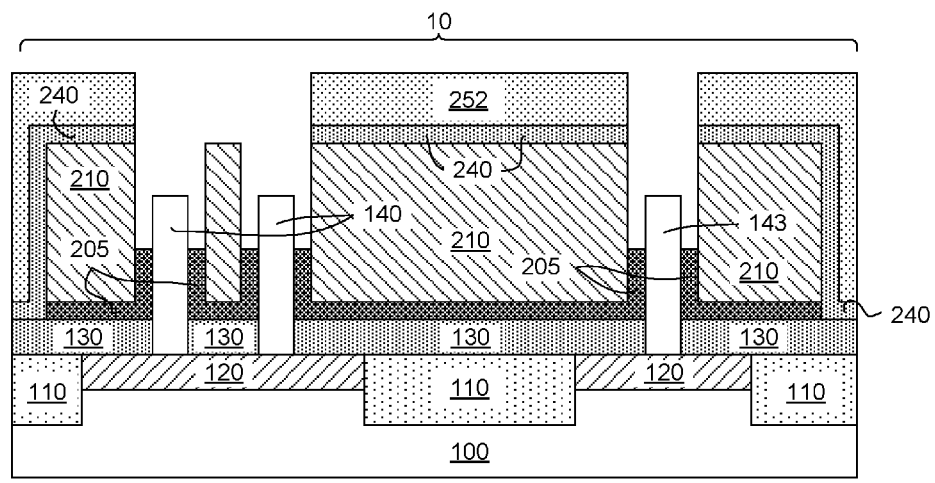
FIG. 9A depicts a cross section of the set of fins in the VFET region on a semiconductor device following etching back the gate dielectric in the VFET region, according to an example embodiment.
Figure 9B:
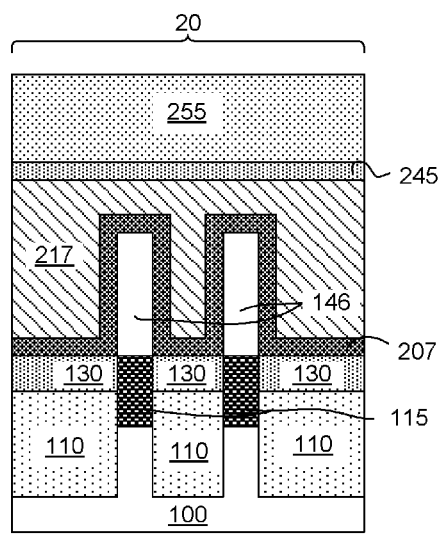
FIG. 9B depicts a cross section of the horizontal fin in the finFET region on the semiconductor device following etching back the gate dielectric in the VFET region, according to an example embodiment.
Figure 9C:
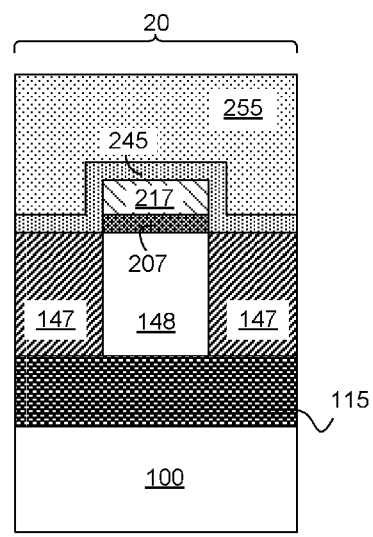
FIG. 9C depicts a side view of the horizontal fin in the finFET region on the semiconductor device following etching back the gate dielectric in the VFET region, according to an example embodiment.

Referring to FIGS. 9A-9C, a selective etch of the VFET dielectric layer 202 may be performed, forming recessed VFET dielectric layer 205. The VFET dielectric layer 202 may be selective etched using any suitable etching technique such as, for example, plasma dry etch, wet H3PO4, wet SC1, wet H2SO4, or wet HF:HCl.

Referring to FIGS. 10A-10C, VFET top spacer 260 and Epitaxial growth of VFET top source/drain 270 may be performed. Referring to FIGS. 10A-10C VFET top source/drain 270 is grown on the dual fins 140 and single fin 143. The VFET top source/drain 270 may include a semiconductor material epitaxially grown on the fin and one or more insulating layers. In some embodiments, a semiconductor material may be epitaxially grown on the existing crystal lattice of the dual fins 140 and single fin 143. In an example embodiment, the semiconductor material may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm$^3$ to approximately $2 \times 10^{21}$ atoms/cm$^3$.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

The VFET top spacer 260 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The VFET top spacer 260 may be formed by any method known in the art, including conformal deposition of the spacer layer 240 above the semiconductor structure. Following deposition of the VFET top spacer material, CMP may be performed to remove the material located above the VFET ILD 252 and ILD 255.

Figure 11A:
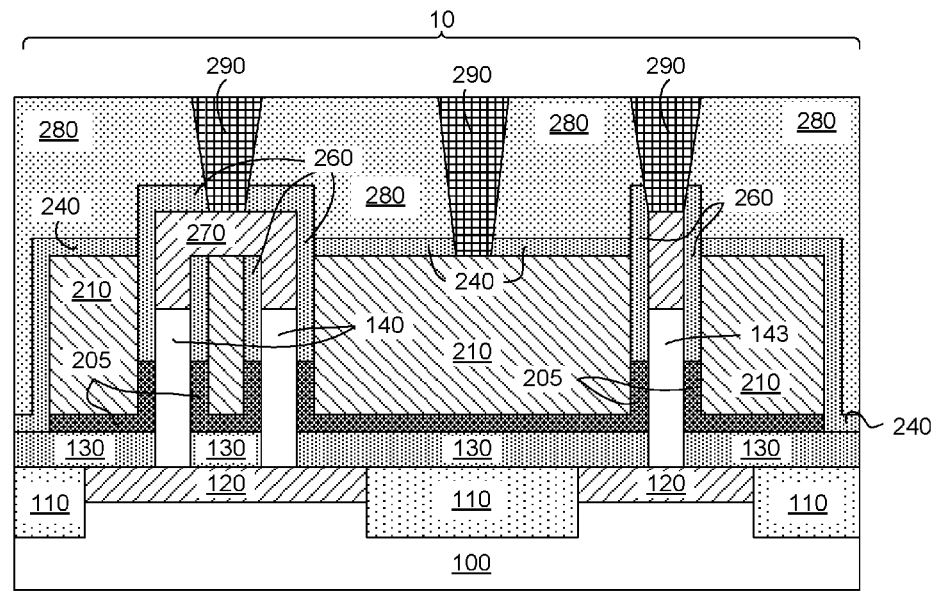
FIG. 11A depicts a cross section of the set of fins in the VFET region on a semiconductor device following contact formation, according to an example embodiment.
Figure 11B:
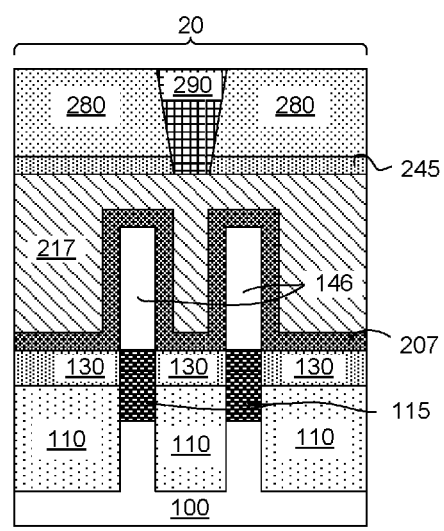
FIG. 11B depicts a cross section of the horizontal fin in the finFET region on the semiconductor device following contact formation, according to an example embodiment.
Figure 11C:
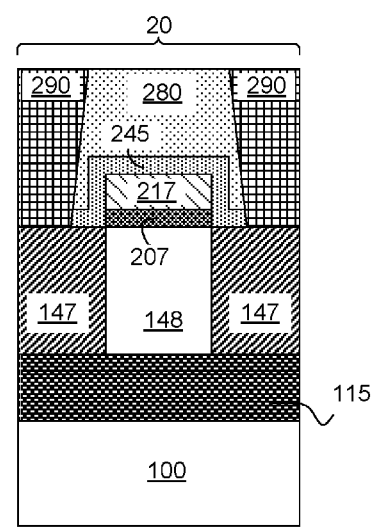
FIG. 11C depicts a side view of the horizontal fin in the finFET region on the semiconductor device following contact formation, according to an example embodiment.

Referring to FIGS. 11A-11C, additional dielectric may be deposited, and contacts 290 may be formed, resulting in ILD 280 and contacts 290. With reference to FIG. 4, a ILD 280 may be deposited over the structure, and subsequent damascene or dual damascene structures may be created.

Still referring to FIGS. 11A-11C, an opening may be formed in the ILD 280. The damascene opening may include a trench opening and two via openings. The opening may be formed using any suitable masking and etching technique known in the art. In one embodiment, a dry etching technique using a fluorine based etchant, such as, for example $C_xF_y$, may be used. In one embodiment, the depth of the trench opening may range from about 50 nm to about 100 nm. Also, the via openings may extend vertically from the bottom of the trench opening down to the top of the gate or source/drain.

Referring now to FIGS. 11A-11C, contacts 290, may be formed within the opening. The contacts 290 may contain a liner and a metal fill may be deposited in via recess. The liner may be made of, for example, tantalum or tantalum nitride, and may include one or more layers of liner material. The metal fill may include, for example, copper, aluminum, or tungsten. The liner and metal fill may be formed using a filing technique such as electroplating, electroless plating, chemical vapor deposition, physical vapor deposition or a combination of methods.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    forming a plurality of fins on a substrate, wherein a first fin is located above a bottom source/drain in a VFET region, wherein a second fin is located in a finFET region, and wherein a first hard cap is located on the first fin and a second hard cap is located on the second fin;
    forming a mask over the first fin in the VFET region;
    removing the second hard cap and the mask;
    depositing a gate metal and a gate dielectric surrounding the first fin and the first hard cap in the VFET region and surrounding the second fin in the finFET region;
    removing the gate metal and the gate dielectric above the first hard cap in the VFET region, thereby exposing a vertical surface of the first hard cap;
    forming a protective spacer adjacent to the vertical surface of the first hard cap, wherein a thickness of the protective spacer is greater than a thickness of the gate dielectric;
    forming a first gate in the VFET region and a second gate on the second fin in the finFET region, wherein the first gate and the second gate are formed from the gate metal and the gate dielectric;
    depositing a spacer layer over the finFET region and the VFET region, wherein depositing the spacer layer in the VFET region creates a first surface of a first portion of the spacer layer and a second surface of a second portion of the spacer layer, the first portion being located above the first hard cap and the second portion being located above the gate metal; forming an insulating layer above the spacer layer in the finFET region and the VFET region; and removing the insulating layer located above the first surface of the spacer layer;
    forming a finFET source drain on the second fin in the finFET region;

removing the protective spacer and the first hard cap; and
forming a top source/drain on the first fin.

2. The method of claim 1, wherein the first hard cap comprises a top cap layer, and wherein a material of the top cap layer is the same as a material of the protective spacer.

3. The method of claim 1, wherein removing the first hard cap further comprises removing the spacer layer and the protective spacer located beneath the first surface of the spacer layer.

4. The method of claim 1, wherein the insulating layer located above the spacer layer is removed by chemical mechanical polishing.

5. The method of claim 1 further comprising:
prior to forming the top source/drain of the first fin, recessing the gate dielectric located along a vertical portion of the first fin.

6. The method of claim 2, wherein the first hard cap further comprises an intermediate cap layer disposed between the top cap layer and a bottom cap layer, wherein the intermediate cap layer comprises a dummy material capable of being selectively removed with respect to the bottom cap layer.

7. The method of claim 6, wherein a thickness of the intermediate cap layer is about 10 to about 50 nm, and wherein a thickness of the bottom cap layer is about 1 to about 5 nm.

8. The method of claim 7, wherein the top cap layer comprises silicon nitride, wherein the bottom cap layer comprises silicon oxide, and wherein the intermediate cap layer comprises amorphous silicon.

9. A method of forming a semiconductor structure, the method comprising:
forming a plurality of fins on a substrate, wherein a first fin is located above a bottom source/drain in a VFET region, wherein a second fin is located in a finFET region, and wherein a first hard cap is located on the first fin and a second hard cap is located on the second fin;
removing the second hard cap;
depositing a gate metal and a gate dielectric surrounding the first fin and the first hard cap in the VFET region and surrounding the second fin in the finFET region;
removing the gate metal and the gate dielectric above the first hard cap in the VFET region, thereby exposing a vertical surface of the first hard cap;
forming a protective spacer adjacent to the vertical surface of the first hard cap, wherein a thickness of the protective spacer is greater than a thickness of the gate dielectric;
forming a first gate in the VFET region and a second gate on the second fin in the finFET region from the gate metal and the gate dielectric;
depositing a spacer layer over the finFET region and the VFET region, wherein depositing the spacer layer in the VFET region creates a first surface of the spacer layer from a portion of the spacer layer located above the first hard cap and a second surface of the spacer layer above the gate metal;
forming an insulating layer above the spacer layer in the finFET region and the VFET region;
removing the insulating layer located above the first surface of the spacer layer in the VFET region;
forming a finFET source drain on the second fin in the finFET region;
removing the protective spacer and the first hard cap; and
forming a top source/drain on the first fin.

10. The method of claim 9, wherein the first hard cap comprises a top cap layer, and wherein a material of the top cap layer is the same as a material of the protective spacer.

11. The method of claim 9, further comprising removing the spacer layer, the first hard cap and the protective spacer located beneath the first surface of the spacer layer.

12. The method of claim 9, wherein removing the insulating layer located above the spacer layer comprises chemical mechanical polishing.

13. The method of claim 9 further comprising:
prior to forming the top source/drain of the first fin, recessing the gate dielectric located along a vertical portion of the first fin.

14. The method of claim 10, wherein the first hard cap further comprises an intermediate cap layer disposed between the top cap layer and a bottom cap layer, wherein the intermediate cap layer comprises a dummy material capable of being selectively removed with respect to the bottom cap layer.

15. The method of claim 14, wherein a thickness of the intermediate cap layer is about 10 to about 50 nm, and wherein a thickness of the bottom cap layer is about 1 to about 5 nm.

16. The method of claim 15, wherein the top cap layer comprises silicon nitride, wherein the bottom cap layer comprises silicon oxide, and wherein the intermediate cap layer comprises amorphous silicon.

17. A method of forming a semiconductor structure, the method comprising:
forming a plurality of fins on a substrate, wherein a first fin is located above a bottom source/drain in a VFET region, wherein a second fin is located in a finFET region;
depositing a gate metal and a gate dielectric surrounding the first fin in the VFET region, and surrounding the second fin in the finFET region;
removing the gate metal and the gate dielectric above the first fin in the VFET region, and exposing a vertical surface of the first fin;
forming a protective spacer adjacent to the vertical surface of the first fin, wherein a thickness of the protective spacer is greater than a thickness of the gate dielectric;
forming a first gate in the VFET region and a second gate the second fin in the finFET region from the gate metal and the gate dielectric;
depositing a spacer layer over the finFET region and the VFET region, wherein depositing the spacer layer in the VFET region creates a first surface of the spacer layer in the portion of the spacer layer located above the first fin and a second surface of the spacer layer above the gate metal;
forming an insulating layer above the spacer layer in the finFET region and the VFET region;
removing the insulating layer located above the first surface of the spacer layer in the VFET region;
forming a finFET source drain on the second fin in the finFET region;
removing the protective spacer; and
forming a top source/drain on the first fin.

18. The method of claim 17, wherein removing the insulating layer located above the spacer layer comprises chemical mechanical polishing.

19. The method of claim 17 further comprising:
prior to forming the top source/drain of the first fin, recessing the gate dielectric located along a vertical portion of the first fin.

\* \* \* \* \*